United States Patent
Ma et al.

(10) Patent No.: US 7,611,976 B2
(45) Date of Patent: Nov. 3, 2009

(54) GATE ELECTRODE DOPANT ACTIVATION METHOD FOR SEMICONDUCTOR MANUFACTURING

(75) Inventors: Yi Ma, Santa Clara, CA (US); Khaled Z. Ahmed, Anaheim, CA (US); Kevin L. Cunningham, Mountain View, CA (US); Robert C. McIntosh, San Jose, CA (US); Abhilash J. Mayur, Salinas, CA (US); Haifan Liang, Oakland, CA (US); Mark Yam, Monte Sereno, CA (US); Toi Yue Becky Leung, Sunnyvale, CA (US); Christopher Olsen, Fremont, CA (US); Shulin Wang, Campbell, CA (US); Majeed Foad, Sunnyvale, CA (US); Gary Eugene Miner, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 320 days.

(21) Appl. No.: 11/428,758

(22) Filed: Jul. 5, 2006

(65) Prior Publication Data

US 2006/0286763 A1  Dec. 21, 2006

Related U.S. Application Data

(63) Continuation of application No. 10/784,904, filed on Feb. 23, 2004, now Pat. No. 7,078,302.

(51) Int. Cl.
 *H01L 21/425* (2006.01)
(52) U.S. Cl. ............... 438/530; 438/532; 257/E21.347
(58) Field of Classification Search ............... 438/308, 438/530, 532, 663; 257/E21.347
See application file for complete search history.

(56) References Cited

U.S. PATENT DOCUMENTS 4,834,831 A  5/1989  Nishizawa et al.

(Continued)

FOREIGN PATENT DOCUMENTS

CN  1419708  5/2003

(Continued)

OTHER PUBLICATIONS

Choi, et al. "Stability of $TiB_2$ as a Diffusion Barrier on Silicon," J. Electrochem. Soc., vol. 138, No. 10, Oct. 1991.

(Continued)

*Primary Examiner*—Chandra Chaudhari
(74) *Attorney, Agent, or Firm*—Patterson & Sheridan, LLP

(57) ABSTRACT

Embodiments of the invention generally provide a method for forming a doped silicon-containing material on a substrate. In one embodiment, the method provides depositing a polycrystalline layer on a dielectric layer and implanting the polycrystalline layer with a dopant to form a doped polycrystalline layer having a dopant concentration within a range from about $1 \times 10^{19}$ atoms/cm$^3$ to about $1 \times 10^{21}$ atoms/cm$^3$, wherein the doped polycrystalline layer contains silicon or may contain germanium, carbon, or boron. The substrate may be heated to a temperature of about 800° C. or higher, such as about 1,000° C., during the rapid thermal anneal. Subsequently, the doped polycrystalline layer may be exposed to a laser anneal and heated to a temperature of about 1,000° C. or greater, such within a range from about 1,050° C. to about 1,400° C., for about 500 milliseconds or less, such as about 100 milliseconds or less.

43 Claims, 3 Drawing Sheets

U.S. PATENT DOCUMENTS

| | | | |
|---|---|---|---|
| 5,112,439 A | 5/1992 | Reisman et al. | |
| 5,273,930 A | 12/1993 | Steele et al. | |
| 5,294,286 A | 3/1994 | Nishizawa et al. | |
| 5,372,860 A | 12/1994 | Fehlner et al. | |
| 5,374,570 A | 12/1994 | Nasu et al. | |
| 5,399,506 A | 3/1995 | Tsukamoto | |
| 5,469,806 A | 11/1995 | Mochizuki et al. | |
| 5,480,818 A | 1/1996 | Matsumoto et al. | |
| 5,527,733 A | 6/1996 | Nishizawa et al. | |
| 5,674,304 A | 10/1997 | Fukada et al. | |
| 5,693,139 A | 12/1997 | Nishizawa et al. | |
| 5,796,116 A | 8/1998 | Nakata et al. | |
| 5,807,792 A | 9/1998 | Ilg et al. | |
| 5,906,680 A | 5/1999 | Meyerson | |
| 5,908,307 A | 6/1999 | Talwar et al. | |
| 5,966,605 A | 10/1999 | Ishida | |
| 6,025,627 A | 2/2000 | Forbes et al. | |
| 6,042,654 A | 3/2000 | Comita et al. | |
| 6,100,171 A | 8/2000 | Ishida | |
| 6,159,852 A | 12/2000 | Nuttall et al. | |
| 6,232,196 B1 | 5/2001 | Raaijmakers et al. | |
| 6,284,686 B1 | 9/2001 | Marlor | |
| 6,291,319 B1 | 9/2001 | Yu et al. | |
| 6,303,476 B1 | 10/2001 | Hawryluk et al. | |
| 6,335,280 B1 | 1/2002 | Van Der Jeugd | |
| 6,348,420 B1 | 2/2002 | Raaijmakers et al. | |
| 6,352,945 B1 | 3/2002 | Matsuki et al. | |
| 6,358,829 B2 | 3/2002 | Yoon et al. | |
| 6,383,955 B1 | 5/2002 | Matsuki et al. | |
| 6,383,956 B2 | 5/2002 | Hawryluk et al. | |
| 6,387,761 B1 | 5/2002 | Shih et al. | |
| 6,410,463 B1 | 6/2002 | Matsuki | |
| 6,451,119 B2 | 9/2002 | Sneh et al. | |
| 6,458,718 B1 | 10/2002 | Todd | |
| 6,489,241 B1 | 12/2002 | Thilderkvist et al. | |
| 6,544,900 B2 | 4/2003 | Raaijmakers et al. | |
| 6,559,520 B2 | 5/2003 | Matsuki et al. | |
| 6,562,720 B2 | 5/2003 | Thilderkvist et al. | |
| 6,635,588 B1 | 10/2003 | Hawryluk et al. | |
| 6,645,838 B1 | 11/2003 | Talwar et al. | |
| 6,784,101 B1 | 8/2004 | Yu et al. | |
| 6,797,558 B2 | 9/2004 | Nuttall et al. | |
| 6,821,825 B2 | 11/2004 | Todd et al. | |
| 6,821,868 B2 * | 11/2004 | Cheng et al. | 438/517 |
| 6,998,305 B2 | 2/2006 | Arena et al. | |
| 2001/0020712 A1 | 9/2001 | Raaijmakers et al. | |
| 2001/0024871 A1 | 9/2001 | Yagi | |
| 2001/0046567 A1 | 11/2001 | Matsuki et al. | |
| 2001/0055672 A1 | 12/2001 | Todd | |
| 2002/0019148 A1 | 2/2002 | Hawryluk et al. | |
| 2002/0022294 A1 | 2/2002 | Hawryluk et al. | |
| 2002/0090818 A1 | 7/2002 | Thilderkvist et al. | |
| 2002/0093042 A1 | 7/2002 | Oh et al. | |
| 2002/0145168 A1 | 10/2002 | Bojarczuk, Jr. et al. | |
| 2002/0168868 A1 | 11/2002 | Todd | |
| 2002/0173113 A1 | 11/2002 | Todd | |
| 2002/0173130 A1 | 11/2002 | Pomerede et al. | |
| 2002/0197831 A1 | 12/2002 | Todd et al. | |
| 2003/0022528 A1 | 1/2003 | Todd | |
| 2003/0036268 A1 | 2/2003 | Brabant et al. | |
| 2003/0045074 A1 | 3/2003 | Seibel et al. | |
| 2003/0082300 A1 | 5/2003 | Todd et al. | |
| 2003/0189208 A1 | 10/2003 | Law et al. | |
| 2004/0018702 A1 * | 1/2004 | Ito et al. | 438/530 |
| 2004/0033674 A1 | 2/2004 | Todd | |
| 2004/0226911 A1 | 11/2004 | Dutton et al. | |
| 2004/0235229 A1 | 11/2004 | Hokazono | |
| 2004/0253776 A1 | 12/2004 | Hoffmann et al. | |
| 2005/0079691 A1 | 4/2005 | Kim et al. | |
| 2005/0170604 A1 | 8/2005 | Orlowski et al. | |

FOREIGN PATENT DOCUMENTS

| | | |
|---|---|---|
| EP | 1 150 345 | 10/2001 |
| JP | 58-098917 | 6/1983 |
| JP | 62-171999 | 7/1987 |
| JP | 63-062313 | 3/1988 |
| JP | 01-270593 | 10/1989 |
| JP | 03-286522 | 12/1991 |
| JP | 05-047665 | 2/1993 |
| JP | 05-102189 | 4/1993 |
| JP | 02-172895 | 7/1993 |
| JP | 2001-111000 | 4/2001 |
| JP | 2001-189312 | 5/2001 |
| WO | WO 98/20524 | 5/1998 |
| WO | WO 01/41544 | 6/2001 |
| WO | WO 01/71787 | 9/2001 |
| WO | WO 02/064853 | 8/2002 |
| WO | WO 02/065508 | 8/2002 |
| WO | WO 02/065516 | 8/2002 |
| WO | WO 02/065517 | 8/2002 |
| WO | WO 02/065525 | 8/2002 |
| WO | WO 02/080244 | 10/2002 |
| WO | WO 02/097864 | 12/2002 |

OTHER PUBLICATIONS

Debusschere, et al. "Importance of determining the polysilicon dopant profile during process development," J. Vac. Sci. Technol. B 14(1), Jan./Feb. 1996.

Earles, et al. "Nonmelt Laser Annealing of 5-KeV and 1-KeV Boron-Implanted Silicon," IEEE Transactions on Electron Devices, vol. 49, No. 7, Jul. 2002.

Goto, et al. "Ultra-Low Contact Resistance for Deca-nm MOSFETs by Laser Annealing", Electron Devices Meeting, 1999. IEDM Technical Digest. International Washington, DC, USA Dec. 5-8, 1999, Piscataway, NJ, USA, IEEE, US Dec. 5, 1999 (Dec. 2, 1999), pp. 931-933, XP01037226.

International Preliminary Report and Written Opinion of the International Searching Authority for International Application No. PCT/US2005/004318 dated Sep. 8, 2006.

International Search Report for International Application No. PCT/US2004/030872 dated Feb. 22, 2005.

Jeong, et al. "Growth and Characterization of Aluminum Oxide $Al_2O_3$ Thin Films by Plasma-assisted Atomic Layer Controlled Deposition," J. Korean Inst. Met. Mater., vol. 38, No. 10, Oct. 2000.

Jeong, et al. "Plasma-assisted Atomic Layer Growth of High-Quality Aluminum Oxide Thin Films," Jpn. J. Appl. Phys. 1, Regul. Pap. Short Notes, vol. 40, No. 1, Jan. 2001.

Kamins, et al. "Kinetics of selective epitaxial deposition of $Si_{1-x}Ge_x$", Applied Physics Letters, American Institute pf Physics. New York, US, vol. 61, No. 6, Aug. 10, 1992, pp. 669-671.

Lee, et al. "Cyclic Technique for the Enhancement of Highly Oriented Diamond Film Growth," Thin Solid Films 303 (1997) 264-269.

Menon, et al. "Loading effect in SiGe layers grown by dichlorosilane- and silane-based epitaxy", Journal of Applied Physics, American Institute of Physics. New York, US, vol. 90, No. 9, Nov. 1, 2001, pp. 4805-4809.

Paranjpe, et al. "Atomic Layer Deposition of $AlO_x$ for Thin Film Head Gap Applications," J. Electrochem. Soc., vol. 148, No. 9, Sep. 2001.

Sedgwick, et al. "Selective SiGe and heavily As doped Si deposited at low temperature by atmospheric pressure chemical vapor deposition", Journal of Vacuum Science and Technology: Part B, American Institute of Physics. New York, US, vol. 11, No. 3, May 1, 1993, pp. 1124-1128.

Talwar, et al. "Junction sealing unsing lasers for thermal annealing," Solid State Technology, vol. 46, Issue 7, Jul. 2003.

Uchino, et al. "A Raised Source/Drain Technology Using In-situ P-doped SiGe and B-doped Si for 0.1 μm CMOS ULSIs", Electron Devices Meeting, 1997. Technical Digest, International Washington, DC, USA Dec. 7-10, 1991, New York, NY, USA, IEEE, US, Dec. 7, 1997, pp. 479-482.

Yamashita et al. "Kinetics of Boron Activation by Flash Lamp Annealing," Extended Abstracts of the 2003 International Conference on Solid State Devices and Materials, Tokyo, 2003, pp. 742-743.

Wolf, et al. "Silicon Processing for the VLSI Era, vol. I: Process Technology," Lattice Press, Sunset Beach, CA, 1986, pp. 264-265.

Notification of First Office Action dated Feb. 15, 2008 for Chinese Patent Application No. 200580005104.0.

Ken-Ichi Goto, et al., "Ultra-Low Contact Resistance for Deca-nm MOSFET's by Laser Annealing", IEEE (1999), pp. 20.7.1-20.7.3.

* cited by examiner

GATE ELECTRODE DOPANT ACTIVATION METHOD FOR SEMICONDUCTOR MANUFACTURING

CROSS-REFERENCE TO RELATED APPLICATIONS

This application is a continuation of U.S. Ser. No. 10/784,904, filed Feb. 23, 2004, now issued as U.S. Pat. No. 7,078,302, which is herein incorporated by reference in its entirety.

BACKGROUND OF THE INVENTION

1. Field of the Invention

Embodiments of the invention generally relate to the field of semiconductor manufacturing processes, more particular, to methods for dopant activation within silicon-containing films forming semiconductor devices, such as gate electrodes.

2. Description of the Related Art

As smaller transistors are manufactured, thinner gate dielectric material is needed to enhance device performance. However, the carrier depletion contributes about 4 Å to inversion oxide thickness gate electrode material, such as p-type polysilicon doped with boron or n-type polysilicon doped with arsenic and/or phosphorous. Reducing the poly-depletion has become critical to maintain the device performance. Conventional processes include a rapid thermal annealing process which has a thermal budget limitation. For example, temperatures higher than 1,050° C. are undesirable since boron penetrates through the gate dielectric material to degrade device performance and reliability.

Ultra shallow source/drain junctions are becoming more challenging to produce as junction depth is required to be less than 30 nm for sub-100 nm CMOS (complementary metal-oxide semiconductor) devices. Conventional doping by implantation followed by thermal post-annealing is less effective as the junction depth approaches the size of 10 nm, since thermal post-annealing causes enhanced dopant diffusion. Dopant diffusion may contaminate nearby layers and cause failure of the device.

Activating the polysilicon gate electrode without causing dopant diffusion is a major challenge for front end of line (FEOL) processing. A tight balance exists between enhanced dopant activation and aggregated dopant diffusion. An aggressive activation anneal may lead to high carrier concentration, but the dopant may be driven into the gate dielectric layer or even into the channel region. The balance becomes more difficult to maintain as device makers try to overcome poly-depletion. Poly-depletion is a reduction of activated dopants within the inversion region of a polysilicon layer. Poly-depletion accounts for an increasing fraction of Tox-inv (carrier concentration/poly-depletion) as gate lengths and gate dielectric thicknesses become smaller. For substrate features within the size of 130 nm and 90 nm, conventional thermal processes such as rapid thermal processing (RTP) and spike annealing are the main dopant activation methods. The resulting poly-depletion contributes 4-5 Å to Tox-inv. An additional reduction of 1 Å of the poly-depletion is necessary for a substrate feature with the size of 65 nm. Drive current gain of about 3% is expected with each angstrom of poly-depletion reduction. Conventional thermal processes are not capable of annealing such small substrate features without provoking dopant diffusion. In addition, preventing dopant penetration and use of thermally sensitive high-k materials requires low thermal budget activation anneal.

Laser anneal, which can achieve high dopant activation without driving dopant diffusion, has been developed to meet the requirements for poly-depletion for use in 65 nm features. Laser annealing technology produces transient temperatures near the silicon melting point within a few milliseconds, which results in high dopant activation with little dopant diffusion. This is a particular benefit for a process such as boron activation, since boron diffuses much faster than does phosphorous and arsenic. However, laser anneal temperatures that melt the silicon has been shown to cause polycrystalline grain size growth which may result in device yield loss.

Therefore, there is a need to have a process for doping polycrystalline layers within a feature and subsequently annealing and activating the doped polycrystalline with minimal or no dopant diffusion.

SUMMARY OF THE INVENTION

In one embodiment, the invention generally provides a method for annealing a doped layer on a substrate including depositing a polycrystalline layer to a gate oxide layer, implanting the polycrystalline layer with a dopant to form a doped polycrystalline layer, exposing the doped polycrystalline layer to a rapid thermal anneal and exposing the doped polycrystalline layer to a laser anneal.

In another embodiment, the invention generally provides a method for annealing a layer on a substrate including depositing a polycrystalline layer containing a lattice to the substrate, doping the polycrystalline layer with at least one dopant element to form a doped polycrystalline layer and annealing the doped polycrystalline layer with a laser to incorporate the at least one dopant element into the lattice.

In another embodiment, the invention generally provides a method for annealing a doped silicon layer on a substrate including depositing a polycrystalline layer to the substrate, doping the polycrystalline layer with at least one dopant element to form a doped polycrystalline layer, exposing the doped polycrystalline layer to a rapid thermal anneal at a first temperature and exposing the doped polycrystalline layer to a laser anneal at a second temperature from about 1,000° C. to about 1,415° C.

In another embodiment, the invention generally provides a method for forming a layer on a substrate including depositing a polycrystalline layer on the substrate. The polycrystalline layer contains a dopant element and a lattice structure. The method further includes annealing the polycrystalline layer with a laser to incorporate the dopant element into the lattice structure forming a doped polycrystalline layer.

BRIEF DESCRIPTION OF THE DRAWINGS

So that the manner in which the above recited features of the invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Embodiments of the invention provide methods for forming a doped polycrystalline silicon layer onto a dielectric material, such as silicon dioxide, silicon oxynitride or a high dielectric constant material. Generally, the polycrystalline layer is doped by ion implantation, thermally annealed, such as with a rapid thermal annealing (RTA) process, and subsequently laser annealed to activate the dopants by a dynamic surface anneal (DSA) process.

Figure 1A:
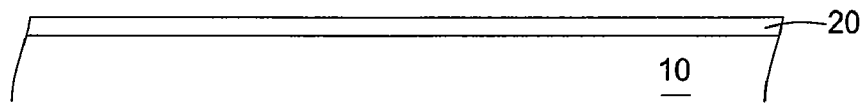
FIGS. 1A-1E depict a step-wise formation of layers within a gate stack structure.

FIGS. 1A-1E show a cross-sectional view of a gate stack structure progressing through processes disclosed in one embodiment of the invention. FIG. 1A depicts a dielectric layer 20 disposed on a substrate 10, such as a silicon substrate used in semiconductor processes. In one example, substrate 10 may be a 300 mm p-type silicon substrate doped with boron to resistivity in a range from about 15 Ω-cm to about 20 Ω-cm and is usually pre-cleaned with a conventional pre-gate clean prior to the deposition of dielectric layer 20.

Dielectric layer 20 may be deposited to substrate 10 by a variety of deposition processes, such as rapid thermal oxidation (RTO), chemical vapor deposition (CVD), plasma enhanced-CVD (PE-CVD), physical vapor deposition (PVD), atomic layer deposition (ALD), atomic layer epitaxy (ALE) or combinations thereof. Preferably, a dielectric material, such as $SiO_2$ or $SiO_xN_y$, is grown on the substrate 10 by an RTO process. Materials suitable as dielectric layer 20 include silicon oxide, silicon nitride, silicon oxynitride, hafnium oxide, hafnium silicate, aluminum oxide, aluminum silicate, zirconium oxide, zirconium silicate, derivatives thereof and combinations thereof. Generally, dielectric layer 20 is deposited with a thickness in a range from about 1 Å to about 150 Å, preferably from about 5 Å to about 50 Å.

In some embodiments, the dielectric material may be nitrided, such as with decoupled plasma nitridation (DPN) or thermal nitridation in nitric oxide (NO) or nitrous oxide ($N_2O$). A post-nitridation anneal is conducted to more strongly bond nitrogen into the oxide and to improve the interface between dielectric layer 20 and the substrate 10. For example, silicon oxide may be grown on substrate 10 by an RTO process, followed by a DPN process to form a silicon oxynitride with a nitrogen concentration in a range from about $1\times10^{14}$ atoms/$cm^2$ to about $1\times10^{16}$ atoms/$cm^2$, for example, about $1\times10^{15}$ atoms/$cm^2$. Other nitrided dielectric materials include aluminum oxynitride, nitrided hafnium silicate, hafnium oxynitride and zirconium oxynitride.

Figure 1B:
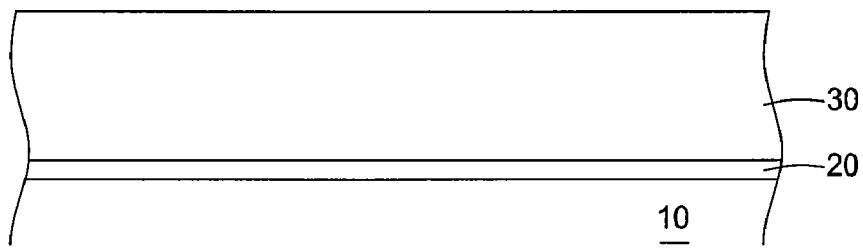
Figure 2:
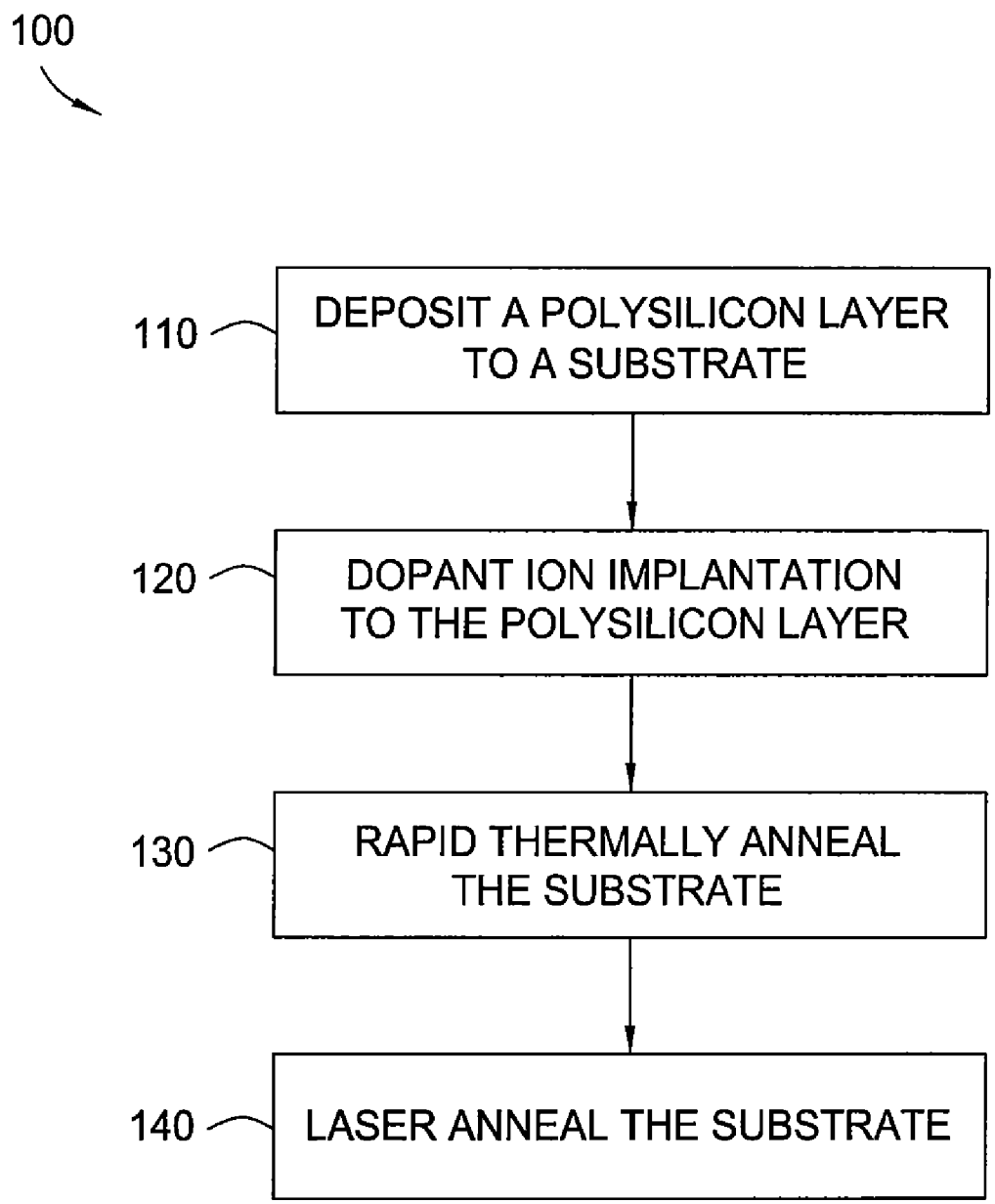
FIG. 2 is a flow chart illustrating a process to deposit a doped polysilicon layer within a gate stack.

In FIG. 2, a flow chart depicts process 100 including step 110 to deposit polysilicon layer 30, such as polycrystalline silicon, onto the dielectric layer 20, as shown in FIG. 1B. Polysilicon layer 30 is generally deposited by chemical vapor deposition (CVD), rapid thermal-CVD (RT-CVD), plasma enhanced-CVD (PE-CVD), physical vapor deposition (PVD), atomic layer deposition (ALD), atomic layer epitaxy (ALE) or combinations thereof. Preferably, the polysilicon layer 30 is deposited with an RT-CVD process at a temperature in a range from about 650° C. to about 800° C., preferably from about 700° C. to about 750° C. During an RT-CVD process, the temperature may be varied to induce variances in grain size of the polysilicon layer 30. For example, the average polysilicon grain size may be about 50 Å larger at 720° C. than at 710° C. Generally, polysilicon layer 30 is deposited with a thickness in a range from about 100 Å to about 10,000 Å, preferably from about 500 Å to about 2,500 Å, and more preferably from about 750 Å to about 1,500 Å. Dual layer polysilicon may also be deposited with an RT-CVD process. Polysilicon layer 30 is generally polycrystalline silicon, but may contain other elements such as germanium and/or carbon. Therefore, polysilicon layer 30 may include Si, SiGe, SiC, or SiGeC. In some examples, the polysilicon layer may have a columnar structure with thin diameter or a dual layer structure combination including a microgram layer on the bottom and a columnar layer on the top.

Hardware that may be used to deposit dielectric layers and/or polysilicon layers include the Epi CENTURA® system and the POLYGEN® system available from Applied Materials, Inc., located in Santa Clara, Calif. A useful rapid-thermal CVD chamber for growing oxides is the Radiance® system available from Applied Materials, Inc., located in Santa Clara, Calif. An ALD apparatus that may be used to deposit high-k layers and/or polysilicon layers is disclosed in commonly assigned U.S. Ser. No. 10/032,284, filed Dec. 21, 2001, published as US 2003-0079686, and issued as U.S. Pat. No. 6,916,398, which is incorporated herein by reference in entirety for the purpose of describing the apparatus. Other apparatuses include batch, high-temperature furnaces, as known in the art.

Figure 1C:
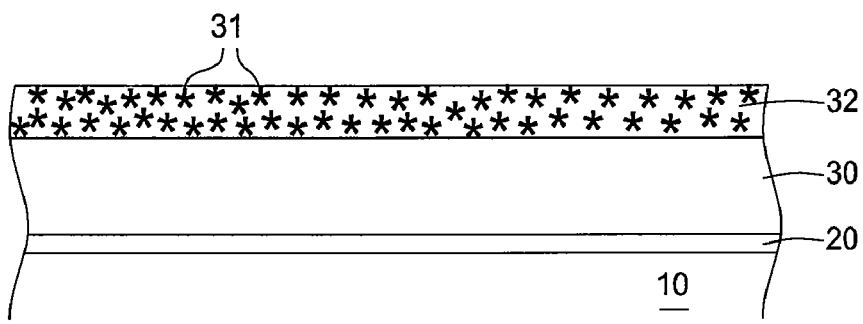

Step 120 includes the doping of polysilicon layer 30 with elemental dopants 31. FIG. 1C illustrates elemental dopants 31 in an upper portion 32 of polysilicon layer 30. The elemental dopants penetrate into the upper portion 32 of polysilicon layer 30 at a depth in a range from about a single atomic layer to about 150 Å, preferably about 70 Å. Elemental dopants may include boron, arsenic, phosphorus, gallium, antimony, indium or combinations thereof. Elemental dopants may have a concentration in the polysilicon layer 30 in a range from about $1\times10^{19}$ atoms/$cm^3$ to about $1\times10^{21}$ atoms/$cm^3$. In one example, polysilicon layer 30 is doped P type, such as by ion implanting of boron to a concentration in the range from about $1\times10^{19}$ atoms/$cm^3$ to about $1\times10^{21}$ atoms/$cm^3$, preferably from about $1\times10^{20}$ atoms/$cm^3$ to about $5\times10^{20}$ atoms/$cm^3$. In another example, polysilicon layer 30 is doped $N^+$ type, such as by ion implanting of phosphorus to a concentration in the range from about $1\times10^{19}$ atoms/$cm^3$ to about $1\times10^{21}$ atoms/$cm^3$, preferably from about $1\times10^{20}$ atoms/$cm^3$ to about $5\times10^{20}$ atoms/$cm^3$. In another example, polysilicon layer 30 is doped $N^-$ type by diffusing arsenic or phosphorus to a concentration in the range from about $1\times10^{15}$ atoms/$cm^3$ to about $1\times10^{19}$ atoms/$cm^3$.

Dopants may be implanted with an ion implantation process, such as described in commonly assigned, U.S. Pat. No. 6,583,018, which is incorporated herein by reference in entirety for the purpose of describing the apparatus. An ion implantation apparatus useful in embodiments of the invention is capable of planting ions with a very low implantation energy, such as about 5 KeV or less, preferably about 3 KeV or less. Two ion implantation apparatuses useful during embodiments of the invention are manufactured and sold as the QUANTUM® III system and the PRECISION IMPLANT 9500 XR® system, both available from Applied Materials, Inc., located in Santa Clara, Calif. Boron may be implanted with an energy setting of about 3 KeV and a dose setting in a range from about $1\times10^{15}$ atoms/$cm^2$ to about $1\times10^{15}$ atoms/$cm^2$. In one example, the boron is implanted at about $4\times10^{15}$ atoms/$cm^2$. In another example, boron is implanted at about $8\times10^{15}$ atoms/$cm^2$.

Figure 1D:
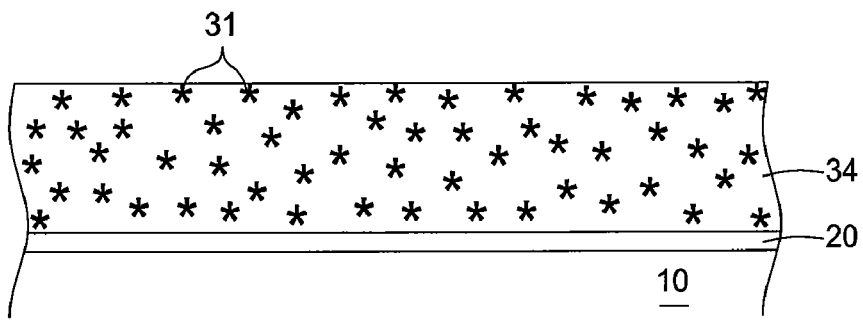

During step 130, the substrate is exposed to a thermal anneal process to diffuse and distribute the dopant elements 31 from the upper portion 32 throughout the polysilicon layer 30 to form a doped polysilicon layer 34. The preferred annealing process is a rapid thermal annealing (RTA) process lasting in a range from about 2 seconds to about 20 seconds, preferably from about 5 seconds to about 10 seconds. During the RTA process, the substrate is heated to a temperature in a range from about 800° C. to about 1,400° C., preferably from about 1,000° C. to about 1,200° C. In one example of an RTA process, the substrate is heated to about 1,000° C. for about 5 seconds. The correct combination of temperature and time during the RTA process distributes elemental dopants 31 are distributed throughout the polysilicon layer 30 without contaminating nearby features in the device, as depicted in FIG. 1D. A process chamber used during RTA processes described herein is the CENTURA® RTP system, available from Applied Materials, Inc., located in Santa Clara, Calif.

Figure 1E:
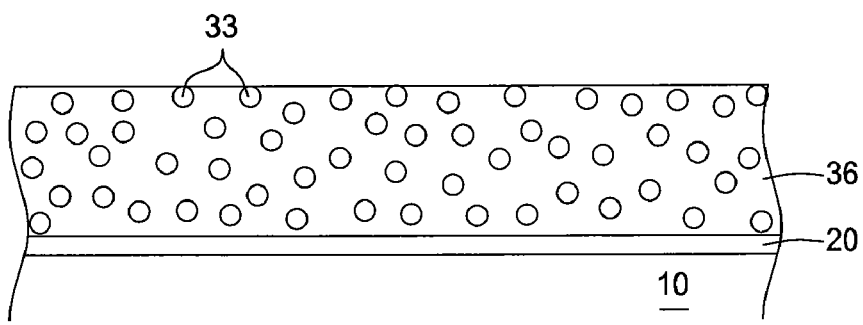

During step 140, the doped polysilicon layer 34 is laser annealed by a dynamic surface annealing (DSA) process. The elemental dopants 31 and the silicon within the doped polysilicon layer 34 are activated during the DSA process to form an activated-doped polysilicon layer 36, as depicted in FIG. 1E. Atom sites within the crystalline lattice of a polysilicon layer are replaced by dopant atoms 33. Therefore, the crystalline lattice, usually silicon, opens and incorporates the incoming dopant atoms 33, such as boron, arsenic, phosphorus, or other dopants described herein.

The doped polysilicon layer 34 is heated during the DSA process near the melting point without actually causing a liquid state. The doped polysilicon layer 34 is heated at a temperature in a range from about 1,000° C. to about 1,415° C., preferably from about 1,050° C. to about 1,400° C. Temperatures higher than the melting point of polycrystalline silicon (about 1,415° C.) are not desirable, since dopant diffusion is likely to cause contamination of other materials within the feature. A layer may be exposed to the substrate during the DSA process for less than about 500 milliseconds, preferably less than 100 milliseconds. The DSA process can be conducted on a DSA platform, available from Applied Materials, Inc., located Santa Clara, Calif. Generally, the laser emits light with a wavelength selected from 10.6 μm or 0.88 μm.

Figure 3A:
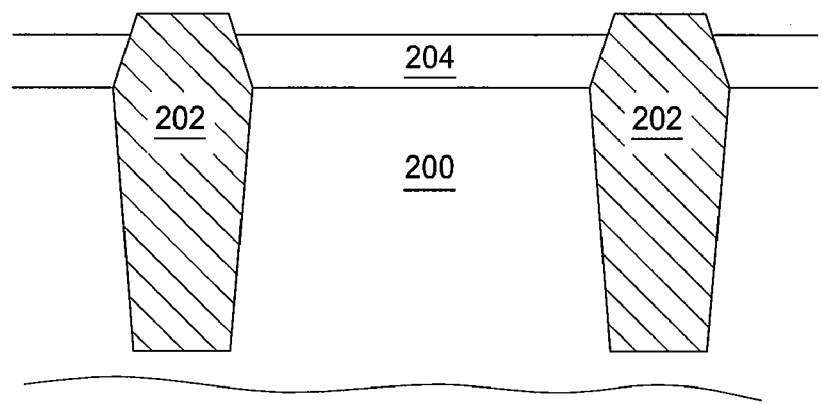
FIGS. 3A-3C depict formation of layers within a gate stack structure.
Figure 3B:
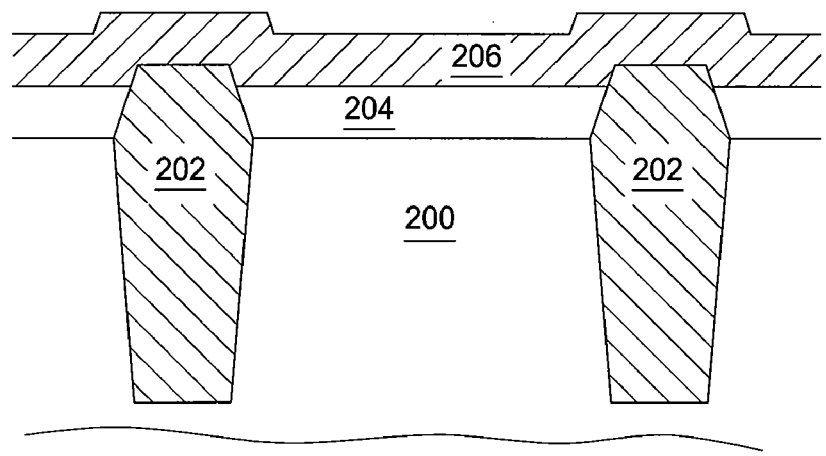
Figure 3C:
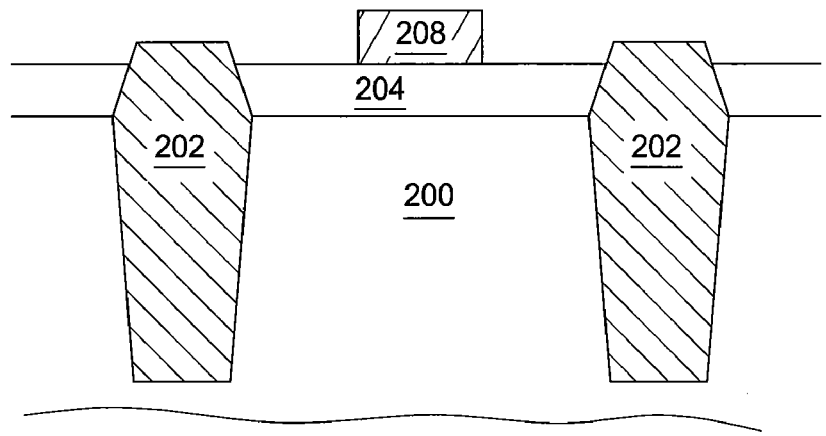

FIGS. 3A-3C depict the deposition of a polysilicon material as described in one embodiment herein to form a gate stack structure. A dielectric layer 204 is deposed on a substrate 200, as shown with a cross-sectional view in FIG. 3A. The substrate 200 may include, though not shown, a variety of features including doped regions. Dielectric layer 204 includes silicon dioxide, silicon oxynitride, silicon nitride and high-k materials as described herein. The substrate 200 further contains shallow trench isolations (STIs) 202. STIs 202 are generally formed by oxidizing the sidewalls of trenches etched into substrate 200 and subsequently filling the trenches with a high density plasma CVD oxide.

FIG. 3B illustrates polysilicon layer 206 deposited on the dielectric layer 204 and the STI 202. Polysilicon layer 206 may be deposited by chemical vapor deposition (CVD), rapid thermal-CVD (RT-CVD), plasma enhanced-CVD (PE-CVD), physical vapor deposition (PVD), atomic layer deposition (ALD), or combinations thereof. In one embodiment, polysilicon layer 206 is deposited with an RT-CVD process at a temperature in a range from about 650° C. to about 800° C., preferably from about 700° C. to about 750° C. Generally, polysilicon layer 206 is deposited with a thickness in a range from about 100 Å to about 10,000 Å, preferably from about 500 Å to about 2,500 Å, and more preferably from about 750 Å to about 1,500 Å. Polysilicon layer 206 is generally polycrystalline silicon, but may contain other elements such as germanium and/or carbon. Therefore, polysilicon layer 206 may include Si, SiGe, SiC, or SiGeC.

Polysilicon layer 206 is patterned and etched to form a patterned polysilicon 208, as depicted in FIG. 3C. Polysilicon layer 206 may be doped prior to being etched, but generally is doped after the formation of patterned polysilicon 208 is formed. Patterned polysilicon 208 may be doped, annealed and/or have more layers deposited thereon, such as an offset spacer (not shown). In one example, patterned polysilicon may be encapsulated with the deposition of an offset spacer and subsequently doped with an ion implantation process, exposed to a RTA annealing process and exposed to a DSA process to activate the implanted dopants.

Experiments

To simulate a doped polycrystalline silicon gate electrode, polycrystalline silicon was deposited on eight substrates (Substrates A-H) containing a layer of silicon oxynitride gate dielectric, as shown in Table 1. The substrates were 300 mm p-type (boron doped) silicon wafers with resistivity of 15-20 Ω-cm. The substrates were exposed to a pre-gate clean, followed by exposure to a rapid thermal oxidation process. A $SiO_2$ film was formed with a thickness of about 20 Å. The $SiO_2$ film was plasma nitrided by decoupled plasma nitridation, resulting in a nitrogen concentration of about $1 \times 10^{15}$ atoms/$cm^2$. All of the substrates were exposed to a post-nitridation anneal to more thoroughly bond nitrogen into the silicon oxide and improve the surface interface.

TABLE 1

| Substrate | Poly-Si (° C.) | [B] ($\times 10^{15}$) | RTA | DSA |
|---|---|---|---|---|
| A | 710 | 4 | x | |
| B | 710 | 4 | x | x |
| C | 720 | 4 | x | |
| D | 720 | 4 | x | x |
| E | 710 | 8 | x | |
| F | 710 | 8 | x | x |
| G | 720 | 8 | x | |
| H | 720 | 8 | x | x |

Polycrystalline silicon was deposited on each substrate with a single-wafer, rapid-thermal chemical vapor deposition chamber to a thickness of about 1,000 Å. The average poly grain size was varied. Polysilicon material was deposited at 710° C. on Substrates A, B, E and F to form first size of grains while, polysilicon was deposited on Substrates C, D, G and H at 720° C. to produce larger sized grains. Boron was implanted with an energy of 3 KeV and a dose setting of $4 \times 10^{15}/cm^2$ to Substrates A-D and $8 \times 10^{15}/cm^2$ for Substrates E-H. All of the substrates went through a conventional RTA process at about 1,000° C. Substrates B, D, F and H were laser annealed by a DSA process at 1,350° C.

The sheet resistance (Rs) and spreading resistance of the resulting structures was measured to evaluate the carrier concentration and activation. The dopant (boron) profiles were analyzed by secondary ion mass spectroscopy (SIMS). Poly grain structure was analyzed with x-ray diffraction spectroscopy (XRD) and cross section transmission electron microscopy (TEM).

The laser anneal reduced the sheet resistance greater than achieved by solely increasing the dopant concentration. For example, doubling the dopant concentration reduced sheet resistance by about 10%. However, while maintaining the dopant concentration at $4 \times 10^{15}/cm^2$, the sheet resistance was reduced as much as 40% for substrates exposed to a DSA process. The sheet resistance was reduced as much as 50% on substrates with doubled dopant concentration and exposed to a DSA process. Poly grain structure had little impact on the sheet resistance. The polysilicon deposited at 720° C. was a few percent lower in sheet resistance then the polysilicon deposited at 710° C. Laser annealing reduced the sheet resistance through at least three mechanisms, such as additional dopant diffusion, alteration of the poly grain structure, and an increase in the dopant activation.

No additional dopant diffusion was observed by SIMS. The dopant was fully diffused by the RTA process, and no changes were seen after the laser anneal process. The laser irradiated each point on the wafer for only a few milliseconds, limiting time the dopant could diffuse despite the high temperature. The polysilicon grain structure did show some minor changes after the laser anneal process. An XRD analysis showed that the grain size increased by 9 Å, from 361 Å to 370 Å after a DSA process. The TEM images showed that the columnar structures were well maintained, but grain structure appeared to be slightly more crystalline. Grain structure changes may have been a contributor to lower sheet resistance. However, there was no conspicuous increase in the grain size that would threaten device yield, as can occur with laser anneals above the silicon melting temperature.

The spreading resistance profiles showed that the carrier concentration increased with the laser anneal temperature throughout the polysilicon. The dopant activation increase was particularly large at the interface between the polysilicon and the oxynitride layer. The higher carrier concentration reduced the poly-depletion. Laser annealing may have reduced the sheet resistance through an increase in dopant activation. The brief, high temperature laser anneal created more carriers in the polysilicon film.

While the foregoing is directed to embodiments of the invention, other and further embodiments of the invention may be devised without departing from the basic scope thereof, and the scope thereof is determined by the claims that follow.

The invention claimed is:

1. A method for forming a doped silicon-containing material on a substrate, comprising:
   depositing a dielectric layer on a substrate;
   exposing the dielectric layer to a nitridation process to form a nitrided dielectric layer;
   depositing a polycrystalline layer on the nitrided dielectric layer;
   implanting the polycrystalline layer with a dopant to form a doped polycrystalline layer having a dopant concentration within a range from about $1\times10^{19}$ atoms/cm$^3$ to about $1\times10^{21}$ atoms/cm$^3$;
   exposing the substrate to a rapid thermal anneal; and
   exposing the doped polycrystalline layer to a laser anneal.

2. The method of claim 1, wherein the dielectric layer comprises a material selected from the group consisting of silicon oxide, silicon oxynitride, hafnium oxide, hafnium silicate, aluminum oxide, aluminum silicate, derivatives thereof, and combinations thereof.

3. The method of claim 2, wherein the dielectric layer comprises a thickness within a range from about 5 Å to about 50 Å.

4. The method of claim 2, wherein the nitrided dielectric layer comprises a material selected from the group consisting of silicon oxynitride, hafnium oxynitride, nitrided hafnium silicate, aluminum oxynitride, derivatives thereof, and combinations thereof.

5. The method of claim 4, wherein the nitridation process is a decoupled plasma nitridation process and the nitrided dielectric layer comprises silicon oxynitride.

6. The method of claim 5, wherein the nitrided dielectric layer comprises a nitrogen concentration within a range from about $1\times10^{14}$ atoms/cm$^2$ to about $1\times10^{16}$ atoms/cm$^2$.

7. The method of claim 1, wherein the doped polycrystalline layer is heated to a temperature of about 1,000° C. or greater during the laser anneal.

8. The method of claim 7, wherein the temperature is about 1,050° C. or greater during the laser anneal.

9. The method of claim 8, wherein the temperature is within a range from about 1,050° C. to about 1,400° C. during the laser anneal.

10. The method of claim 9, wherein the doped polycrystalline layer is exposed to the laser anneal for about 500 milliseconds or less.

11. The method of claim 10, wherein the doped polycrystalline layer is exposed to the laser anneal for about 100 milliseconds or less.

12. The method of claim 1, wherein the substrate is heated to a temperature of about 800° C. or higher during the rapid thermal anneal.

13. The method of claim 12, wherein the temperature is about 1,000° C. or higher during the rapid thermal anneal.

14. The method of claim 13, wherein the doped polycrystalline layer has an electrical resistively of less than about 400 ohms/cm$^2$.

15. The method of claim 1, wherein the doped polycrystalline layer comprises boron at the dopant concentration.

16. The method of claim 15, wherein the doped polycrystalline layer comprises silicon and carbon.

17. The method of claim 15, wherein the doped polycrystalline layer comprises silicon and germanium.

18. The method of claim 17, wherein the doped polycrystalline layer further comprises carbon.

19. A method for forming a doped silicon-containing material on a substrate, comprising:
    depositing a polycrystalline layer on a dielectric layer;
    implanting the polycrystalline layer with a dopant to form a doped polycrystalline layer having a dopant concentration within a range from about $1\times10^{19}$ atoms/cm$^3$ to about $1\times10^{21}$ atoms/cm$^3$, wherein the doped polycrystalline layer comprises silicon, carbon, and boron;
    exposing the substrate to a rapid thermal anneal; and
    exposing the doped polycrystalline layer to a laser anneal.

20. The method of claim 19, wherein the dielectric layer comprises a material selected from the group consisting of silicon oxide, silicon oxynitride, hafnium oxide, hafnium silicate, aluminum oxide, aluminum silicate, derivatives thereof, and combinations thereof.

21. The method of claim 20, wherein the dielectric layer comprises a thickness within a range from about 5 Å to about 50 Å.

22. The method of claim 20, wherein the dielectric layer is exposed to a nitridation process to form a nitrided dielectric layer comprising a material selected from the group consisting of silicon oxynitride, hafnium oxynitride, nitrided hafnium silicate, aluminum oxynitride, derivatives thereof, and combinations thereof.

23. The method of claim 22, wherein the nitridation process is a decoupled plasma nitridation process and the nitrided dielectric layer comprises silicon oxynitride.

24. The method of claim 23, wherein the nitrided dielectric layer comprises a nitrogen concentration within a range from about $1\times10^{14}$ atoms/cm$^2$ to about $1\times10^{16}$ atoms/cm$^2$.

25. The method of claim 19, wherein the doped polycrystalline layer is heated to a temperature of about 1,000° C. or greater during the laser anneal.

26. The method of claim 25, wherein the temperature is about 1,050° C. or greater during the laser anneal.

27. The method of claim 26, wherein the temperature is within a range from about 1,050° C. to about 1,400° C. during the laser anneal.

28. The method of claim 27, wherein the doped polycrystalline layer is exposed to the laser anneal for about 500 milliseconds or less.

29. The method of claim 28, wherein the doped polycrystalline layer is exposed to the laser anneal for about 100 milliseconds or less.

30. The method of claim 19, wherein the substrate is heated to a temperature of about 800° C. or higher during the rapid thermal anneal.

31. The method of claim 30, wherein the temperature is about 1,000° C. or higher during the rapid thermal anneal.

32. A method for forming a doped silicon-containing material on a substrate, comprising:
   depositing a silicon-containing layer on a substrate;
   implanting the silicon-containing layer with a dopant to form a doped silicon-containing layer containing a dopant concentration within a range from about $1 \times 10^{19}$ atoms/cm$^3$ to about $1 \times 10^{21}$ atoms/cm$^3$, wherein the doped silicon-containing layer further comprises carbon;
   exposing the doped silicon-containing layer to a rapid thermal anneal; and
   heating the doped silicon-containing layer to a temperature of about 1,000° C. or greater during a laser anneal.

33. The method of claim 32, wherein the doped silicon-containing layer is a polycrystalline layer.

34. The method of claim 33, wherein the doped silicon-containing layer further comprises germanium.

35. The method of claim 34, wherein the doped silicon-containing layer further comprises boron.

36. The method of claim 32, wherein the doped silicon-containing layer further comprises boron.

37. The method of claim 32, wherein the temperature is about 1,050° C. or greater during the laser anneal.

38. The method of claim 37, wherein the doped silicon-containing layer is heated to a temperature within a range from about 1,050° C. to about 1,400° C. during the laser anneal.

39. The method of claim 38, wherein the doped silicon-containing layer is exposed to the laser anneal for about 100 milliseconds or less.

40. The method of claim 32, wherein the doped silicon-containing layer is heated to a temperature of less than about 1,415° during the laser anneal.

41. The method of claim 40, wherein the doped silicon-containing layer is heated to a temperature of about 1,350° during the laser anneal.

42. The method of claim 32, wherein the substrate is heated to a temperature of about 800° or higher during the rapid thermal anneal.

43. The method of claim 42, wherein the temperature is about 1,000° or higher during the rapid thermal anneal.

* * * * *

UNITED STATES PATENT AND TRADEMARK OFFICE
CERTIFICATE OF CORRECTION

| | | |
|---|---|---|
| PATENT NO. | : 7,611,976 B2 | Page 1 of 1 |
| APPLICATION NO. | : 11/428758 | |
| DATED | : November 3, 2009 | |
| INVENTOR(S) | : Ma et al. | |

It is certified that error appears in the above-identified patent and that said Letters Patent is hereby corrected as shown below:

Column 4, Line 5, please delete "microgram" and insert --micrograin-- therefor.

Signed and Sealed this

Twenty-second Day of December, 2009

David J. Kappos
*Director of the United States Patent and Trademark Office*